US007846622B2

United States Patent
Demachi et al.

(10) Patent No.: US 7,846,622 B2
(45) Date of Patent: Dec. 7, 2010

(54) ALKALI-DEVELOPABLE, COLORED PHOTOSENSITIVE RESIN COMPOSITION AND COLOR FILTER USING THE ALKALI-DEVELOPABLE, COLORED PHOTOSENSITIVE RESIN COMPOSITION

(75) Inventors: Yasuyuki Demachi, Tokyo (JP); Azumi Sato, Tokyo (JP); Hiromitsu Ito, Tokyo (JP); Tadatoshi Maeda, Tokyo (JP); Koichi Kimishima, Tokyo (JP); Masaaki Shimizu, Tokyo (JP); Naomi Sato, Tokyo (JP); Tomohito Ishiguro, Tokyo (JP); Yoshie Makabe, Tokyo (JP)

(73) Assignees: Toppan Printing Co., Ltd., Tokyo (JP); Adeka Corporation, Tokyo (JP)

( * ) Notice: Subject to any disclaimer, the term of this patent is extended or adjusted under 35 U.S.C. 154(b) by 945 days.

(21) Appl. No.: 11/660,981

(22) PCT Filed: Aug. 30, 2005

(86) PCT No.: PCT/JP2005/015721

§ 371 (c)(1),
(2), (4) Date: Feb. 23, 2007

(87) PCT Pub. No.: WO2006/030631

PCT Pub. Date: Mar. 23, 2006

(65) Prior Publication Data

US 2007/0269720 A1  Nov. 22, 2007

(30) Foreign Application Priority Data

Sep. 17, 2004 (JP) .............................. 2004-271725

(51) Int. Cl.
*G03C 1/72* (2006.01)
*G02B 5/20* (2006.01)
(52) U.S. Cl. ....................... 430/7; 430/286.1
(58) Field of Classification Search .................. None
See application file for complete search history.

(56) References Cited

FOREIGN PATENT DOCUMENTS

| JP | 4-033910 | * | 2/1992 |
|---|---|---|---|
| JP | 5-281734 | | 10/1993 |
| JP | 5-339356 | | 12/1993 |
| JP | 9-087346 | * | 3/1997 |
| JP | 2000-053746 | * | 2/2000 |
| JP | 2001-081416 | * | 2/2001 |
| JP | 2003-89716 | | 3/2003 |
| JP | 2003-107702 | | 4/2003 |
| JP | 2004-138950 | | 5/2004 |
| WO | WO 2005/092826 | | 10/2005 |

OTHER PUBLICATIONS

Computer-generated translation of JP 9-087346 (Mar. 1997).*
Computer-generated translation of JP 2001-081416 (Feb. 2001).*
Computer-generated translation of JP 2000-053746 (Feb. 2000).*

* cited by examiner

*Primary Examiner*—John A. McPherson
(74) *Attorney, Agent, or Firm*—Young & Thompson

(57) ABSTRACT

An alkali-developable, colored photosensitive resin composition obtained by adding a colorant and a photopolymerization initiator to an alkali-developable resin composition, containing a reaction product obtained by esterification between an epoxy adduct and a polybasic acid anhydride, the epoxy adduct having a structure formed by adding an unsaturated monobasic acid and a compound selected from a phenol compound, an alcohol compound, an amine compound, and a carboxylic acid to an epoxy resin represented by general formula. The epoxy adduct is formed by adding 0.1 to 1.0 carboxyl group of the unsaturated monobasic acid and 0 to 0.9 phenolic hydroxyl group, alcoholic hydroxyl group, amino group or carboxyl group per epoxy group of the epoxy resin, with the sum of the carboxyl unsaturated monobasic acid and the phenolic hydroxyl group, alcoholic hydroxyl, amino or carboxyl group being 0.1 to 1.0 per epoxy group.

11 Claims, No Drawings

ALKALI-DEVELOPABLE, COLORED PHOTOSENSITIVE RESIN COMPOSITION AND COLOR FILTER USING THE ALKALI-DEVELOPABLE, COLORED PHOTOSENSITIVE RESIN COMPOSITION

TECHNICAL FIELD

This invention relates to an alkali-developable, colored photosensitive resin composition that can be used in liquid crystal displays, plasma displays, electroluminescent panels, color camcorders, etc. and a color filter using the alkali-developable, colored photosensitive resin composition.

BACKGROUND ART

The alkali-developable, colored photosensitive resin composition is an alkali-developable resin composition containing a specific compound having an ethylenically unsaturated bond, a colorant including a pigment and a dye, and a photopolymerization initiator. Capable of curing by polymerization on being irradiated with ultraviolet light or an electron beam, the alkali-developable photosensitive resin composition is applicable to photo-curing inks, photosensitive printing plates, printed wiring boards, various kinds of photoresists, color filters, and so forth.

The recent developments in downsizing and function enhancement of electronic equipment have boosted the demand for fine and precise patterning technology by lithography. In particular, an alkali-developable, colored photosensitive resin composition for color filter application has been required to have higher color purity and higher light shielding performance. Among approaches to meet the demand is a technique of dispersing a pigment or a dye in high concentration in an alkali-developable photosensitive resin. This technique involves a problem that an increase in the proportion of a pigment or a dye in the alkali-developable, colored photosensitive resin composition results in blocking ultraviolet light necessary for patterning and thereby resulting in reduction of sensitivity. A reduction in sensitivity necessitates extension of an exposure time, which can result in reduction of productivity. Therefore, an alkali-developable, colored photosensitive resin composition is required to have sufficient sensitivity, resolving power, intimate adhesion, and alkali resistance.

Alkali developable, colored photosensitive resin compositions heretofore proposed include a photosensitive composition having a coloring component, a polyfunctional thiol compound, and a photo initiator dispersed in a binder containing an acrylic copolymer having a carboxyl group and an ethylenically unsaturated group in the side chain thereof (see, for example, Patent Document 1). Containing a polyfunctional thiol component as an essential component, the composition has associated problems of smell and storage stability. Patent Document 2 discloses a colored photosensitive resin composition comprising an unsaturated group-containing resin and a photopolymerization initiator selected from a triazine compound, an acetophenone compound, and a biimidazole compound. Patent Document 3 and Patent Document 4 disclose an alkali-soluble unsaturated resin and a radiation sensitive resin composition containing the resin. These known alkali-developable photosensitive resin compositions have insufficient sensitivity for forming a proper pattern or a fine pattern and are therefore unsatisfactory for producing high quality color filters.

Patent Document 1: JP-A-5-281734

Patent Documennt 2: JP-A-2004-138950

Patent Document 3: Japanese Patent 3148429

Patent Document 4: JP-A-2003-89716:

DISCLOSURE OF THE INVENTION

As stated above, an alkali-developable, colored photosensitive resin composition for the production of high quality color filters is required to have higher sensitivity, higher resolving power, and better storage stability than before. Additionally, a color filter having a substrate and a cured film of an alkali-developable, colored photosensitive resin composition with good adhesion has been demanded.

An object of the present invention is to provide an alkali-developable, colored photosensitive resin composition having high sensitivity, resolving power and alkali resistance and satisfactory storage stability and a color filter having a coating film of the alkali-developable, colored photosensitive resin composition in good adhesion to a substrate.

The present invention accomplishes the above object by providing an alkali-developable, colored photosensitive resin composition obtained by adding (E) a colorant and (F) a photopolymerization initiator to an alkali-developable resin composition. The alkali-developable resin composition contains a reaction product obtained by esterification between an epoxy adduct and (D) a polybasic acid anhydride. The epoxy adduct has a structure formed by adding (B) an unsaturated monobasic acid and (C) a compound selected from a phenol compound, an alcohol compound, an amine compound, and a carboxylic acid to (A) an epoxy resin represented by general formula (I) shown below. The epoxy adduct has a structure formed by adding 0.1 to 1.0 carboxyl group of the unsaturated monobasic acid (B) and 0 to 0.9 phenolic hydroxyl group, alcoholic hydroxyl group, amino group or carboxyl group of the compound (C) per epoxy group of the epoxy resin (A), with the sum of the carboxyl group of the unsaturated monobasic acid (B) and the phenolic hydroxyl group, alcoholic hydroxyl group, amino group or carboxyl group of the compound (C) being 0.1 to 1.0 per epoxy group. The esterification is carried out at a ratio of 0.1 to 1.0 anhydrous structure of the polybasic acid anhydride (D) per hydroxyl group of the epoxy adduct.

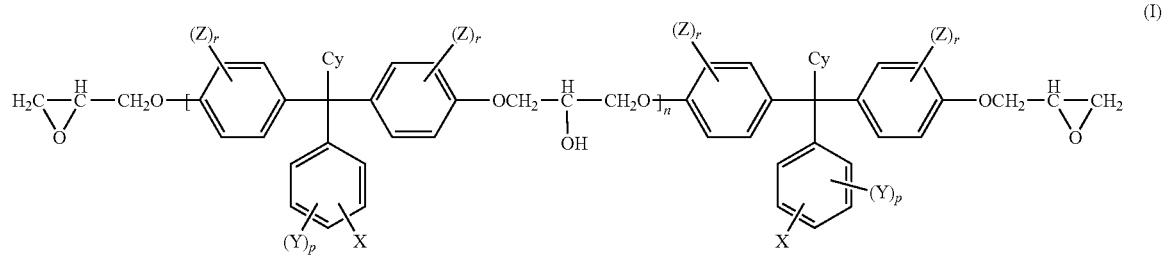

wherein Cy represents a cycloalkyl group having 3 to 10 carbon atoms; X represents a hydrogen atom, a phenyl group which may be substituted with an alkyl group having 1 to 10 carbon atoms or an alkoxy group having 1 to 10 carbon atoms, or a cycloalkyl group having 3 to 10 carbon atoms; Y and Z each represent an alkyl group having 1 to 10 carbon atoms, an alkoxy group having 1 to 10 carbon atoms, an alkenyl group having 2 to 10 carbon atoms or a halogen atom; the alkyl group, the alkoxy group, and the alkenyl group may be substituted with a halogen atom; n represents a number of 0 to 10; p represents a number of 0 to 5; and r represents a number of 0 to 4.

BEST MODE FOR CARRYING OUT THE INVENTION

The alkali-developable, colored photosensitive resin composition of the invention and the color filter of the invention using the alkali-developable, colored photosensitive resin composition will be described in detail based on their preferred embodiments.

The alkali-developable, colored photosensitive resin composition of the invention contains a reaction product obtained by esterifying an epoxy adduct with a polybasic acid anhydride (D). The epoxy adduct has a structure formed by adding, to an epoxy resin (A) represented by general formula (I) shown above, an unsaturated monobasic acid (B) and a compound (C) selected from a phenol compound, an alcohol compound, an amine compound, and a carboxylic acid. The addition reaction is such that 0.1 to 1.0 carboxyl group of the unsaturated monobasic acid (B) and 0 to 0.9 phenolic hydroxyl group, alcoholic hydroxyl group, amino group or carboxyl group of the compound (C) are added per epoxy group of the epoxy resin (A), with the sum of the carboxyl group of the component (B) and the phenolic hydroxyl group, alcoholic hydroxyl group, amino group or carboxyl group of the component (C) being 0.1 to 1.0. The esterification is such that the ratio of the anhydrous structure of the polybasic acid anhydride (D) to the hydroxyl group of the epoxy adduct is 0.1 to 1.0. The composition further contains a colorant (E) and a photopolymerization initiator (F).

The ratio of the carboxyl group of the unsaturated monobasic acid (B) to the epoxy group of the epoxy resin (A) is preferably 0.4 to 1.0. The ratio of the phenolic hydroxyl group, alcoholic hydroxyl group, amino group or carboxyl group of the compound (C) to the epoxy group of the epoxy resin (A) is preferably 0 to 0.6. The sum of the carboxyl group of the component (B) and the phenolic hydroxyl group, alcoholic hydroxyl group, amino group or carboxyl group of the component (C) is preferably 0.4 to 1.0 per epoxy group of the epoxy resin (A). The ratio of the acid anhydride structure of the polybasic acid anhydride (D) to the hydroxyl group of the epoxy compound is preferably 0.4 to 1.0.

In general formula (I), the cycloalkyl group having 3 to 10 carbon atoms includes cyclopropyl, cyclobutyl, cyclopentyl, cyclohexyl, methylcyclohexyl, cycloheptyl, cyclooctyl, cyclononyl, and cyclodecyl. The alkyl group having 1 to 10 carbon atoms represented by Y and Z includes methyl, ethyl, propyl, isopropyl, butyl, isobutyl, sec-butyl, tert-butyl, amyl, isoamyl, tert-amyl, hexyl, heptyl, octyl, isooctyl, tert-octyl, 2-ethylhexyl, nonyl, isononyl, decyl, isodecyl, monofluoromethyl, difluoromethyl, trifluoromethyl, trifluoroethyl, and perfluoroethyl. The alkoxy group having 1 to 10 carbon atoms includes methoxy, ethoxy, propoxy, butoxy, methoxyethyl, ethoxyethyl, propoxyethyl, methoxyethoxyethyl, ethoxyethoxyethyl, propoxyethoxyethyl, and methoxypropyl. The alkenyl group having 2 to 10 carbon atoms includes vinyl, allyl, butenyl, and propenyl. The halogen atom includes fluorine, chlorine, bromine, and iodine.

The epoxy resin as component (A) that is used to prepare the alkali-developable, colored photosensitive resin composition of the invention becomes a cured product excellent in adhesion to a substrate, alkali resistance, processability, strength, and the like probably because of its triarylmonocycloalkylmethane skeleton and therefore forms, upon curing and subsequent removal of an uncured portion (development), a clear image at good precision even with a fine pattern. The epoxy resin (A) is preferably one represented by general formula (I) in which Cy is cyclohexyl; X is phenyl; p and r are each 0; and n is 0 to 5, particularly 0 to 1.

Specific examples of the epoxy resin (A) represented by general formula (I) include compound Nos. 1 through 9 shown below, which are given only for illustrative purposes but not for limitation.

Compound No. 1:

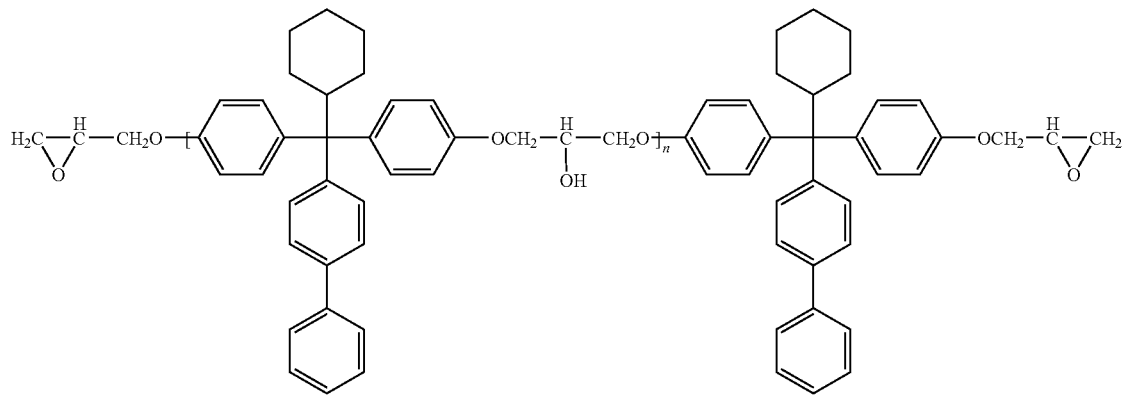

-continued
Compound No. 2:
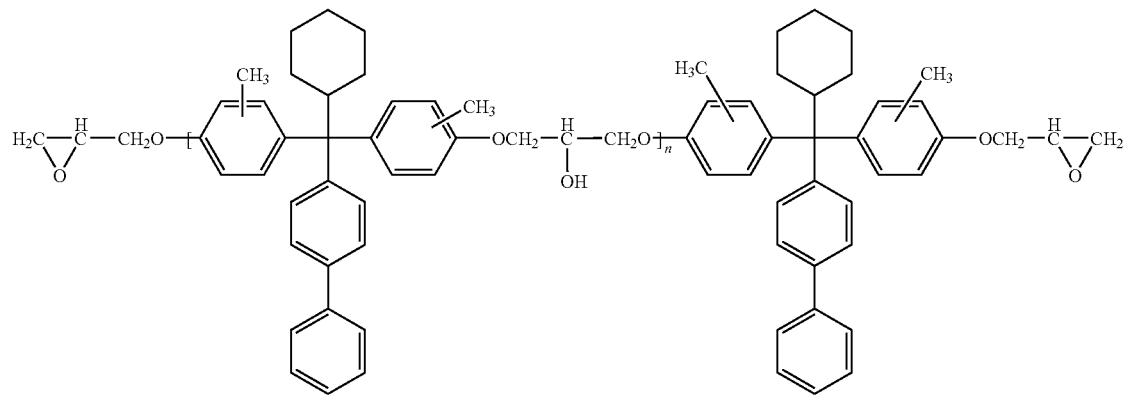
Compound No. 3:
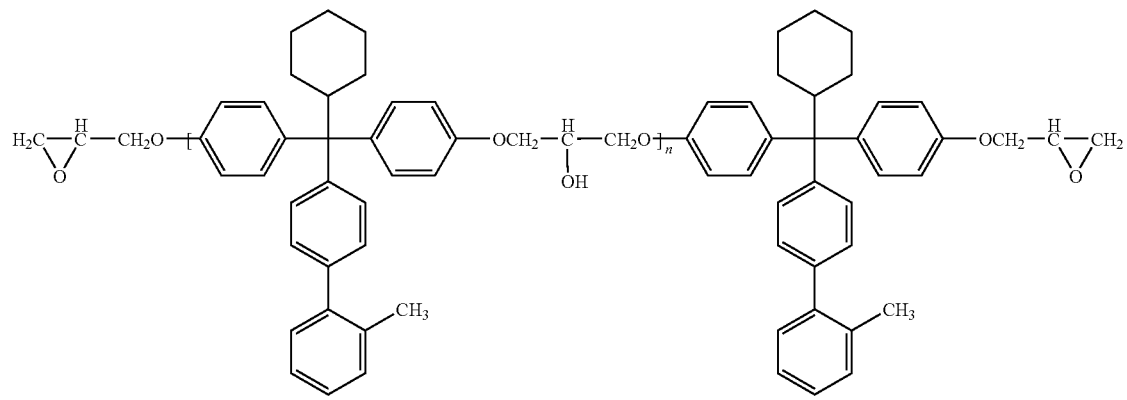
Compound No. 4:
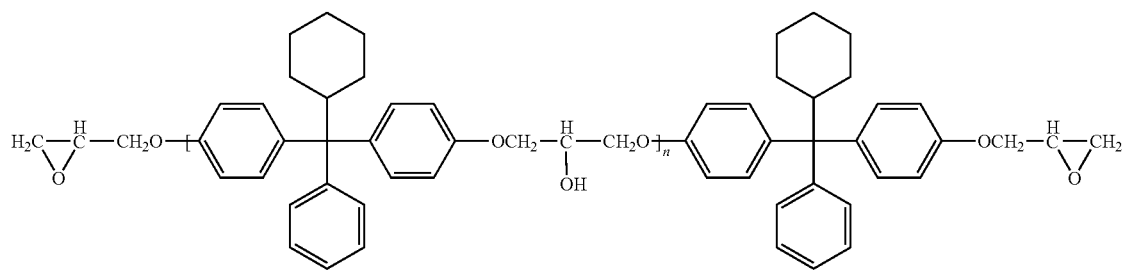
Compound No. 5:
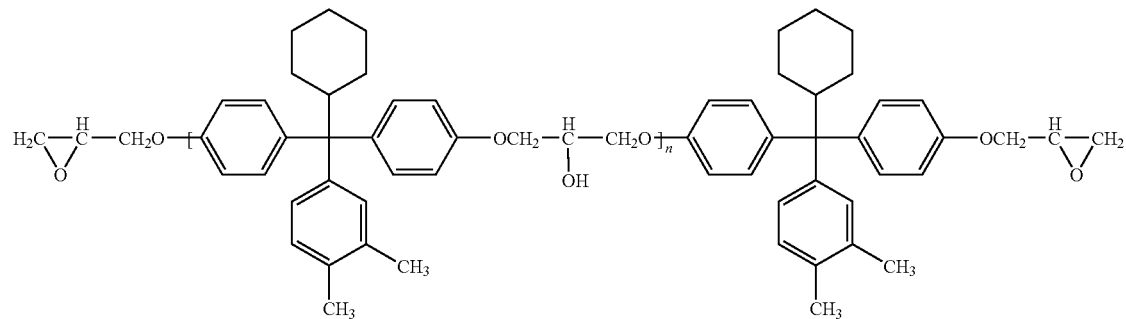

Compound No. 6:
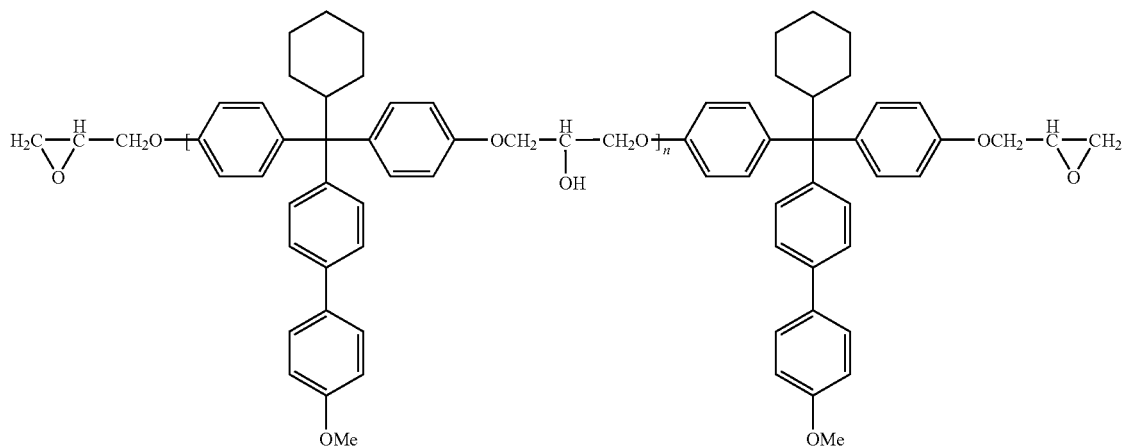
Compound No. 7:
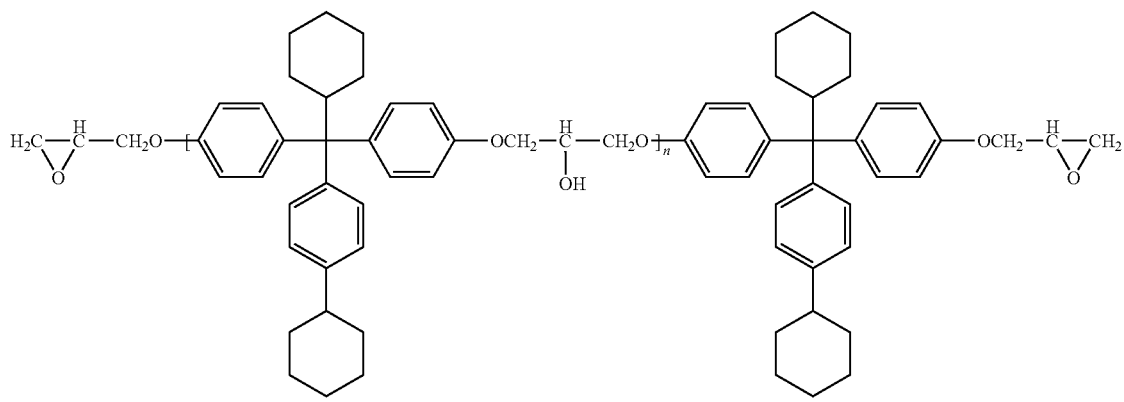
Compound No. 8:
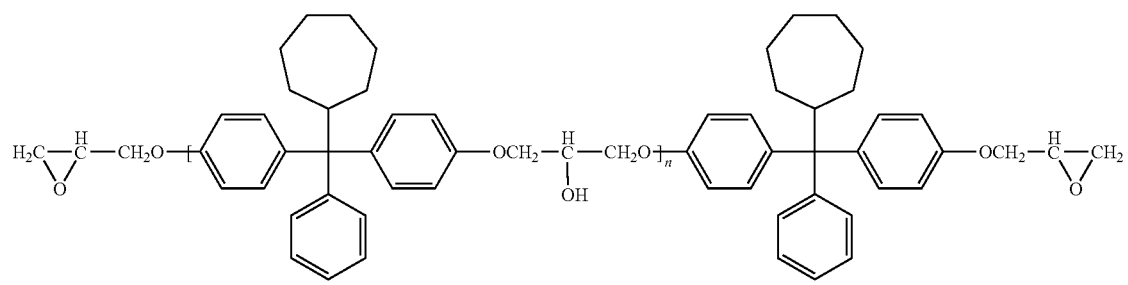

Compound No. 9:

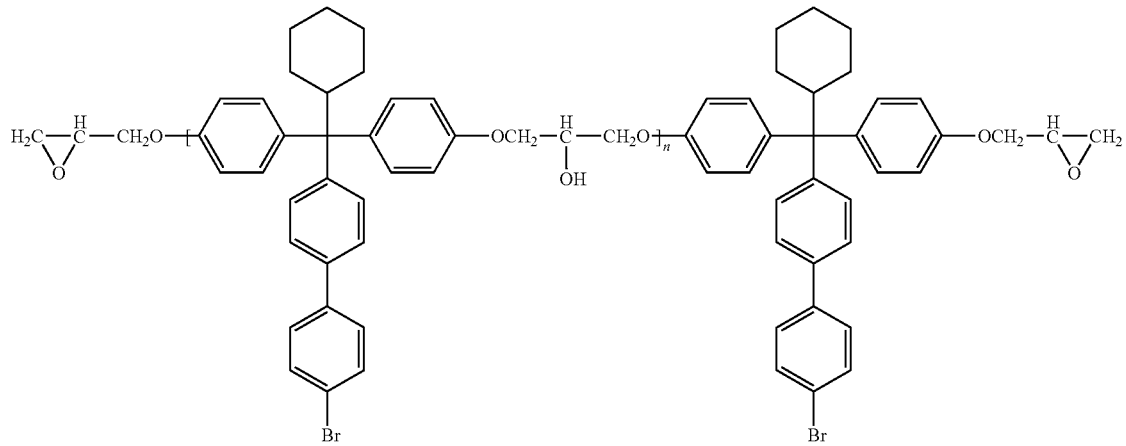

The reaction product obtained by adding the component (B) and, if necessary, the component (C) to the component (A) and esterifying the resulting adduct with the component (D) is prepared according to reaction scheme 1 shown below.

That is, an unsaturated monobasic acid (2) as component (B) and, if desired, a phenol compound (3), etc. as component (C) are added to an epoxy resin (1) as component (A) to obtain a resin composition containing a compound (4), an epoxy adduct. A polybasic acid anhydride (5) as component (D) is then allowed to react on the compound (4) to conduct esterification to obtain a resin composition containing a compound (6) as a desired reaction product. If desired, an epoxy compound (7) as component (G) is allowed to react on the compound (6) to obtain a resin composition containing a compound (8).

Reaction Scheme 1:

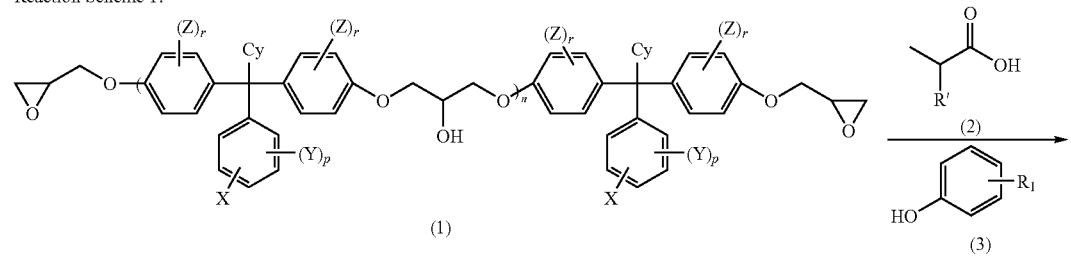

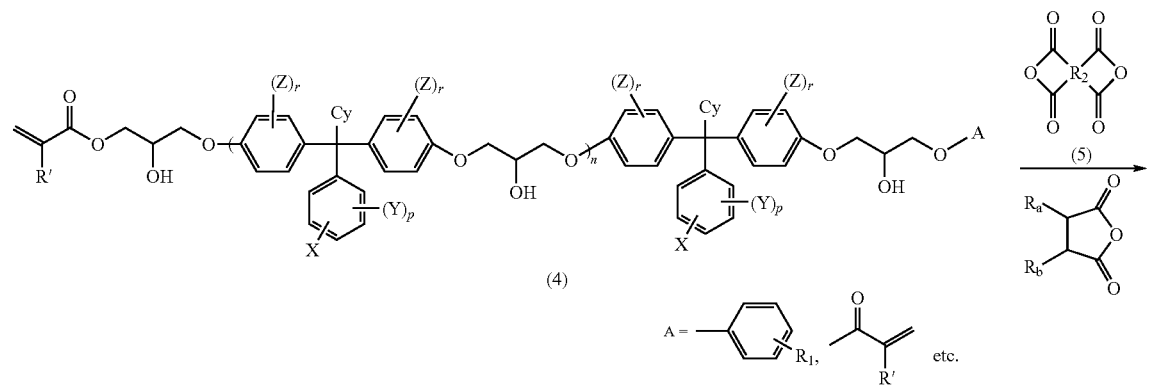

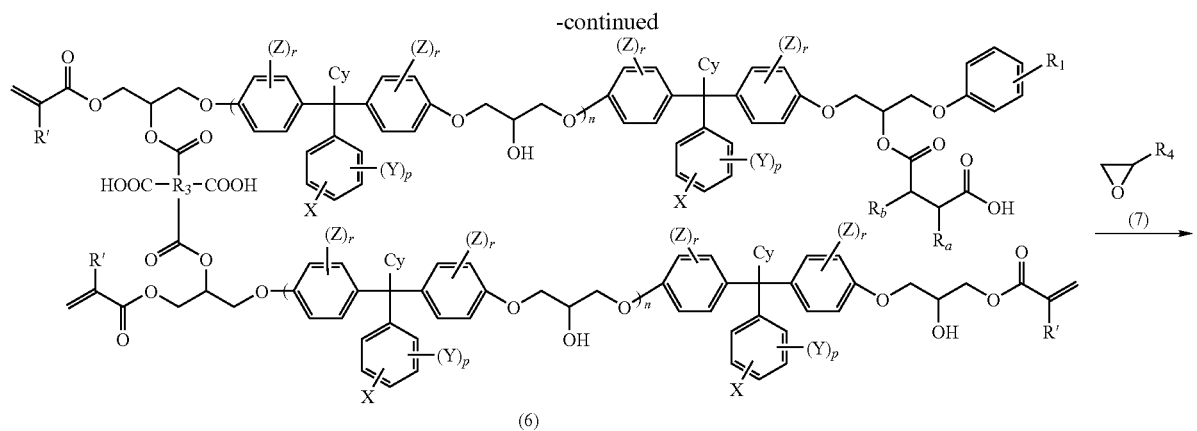
(6)
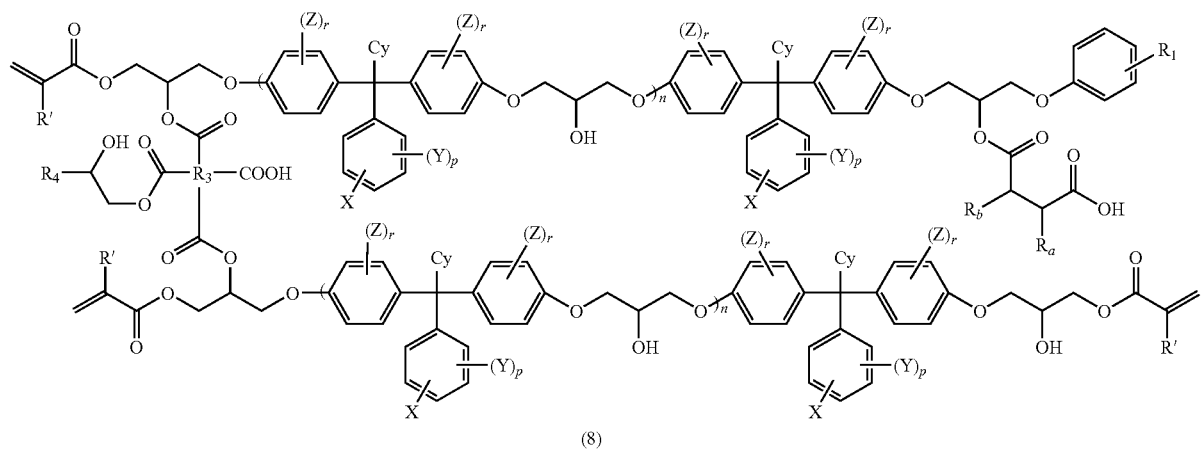
(8)
The process of preparing the compound (4) (the epoxy adduct used in reaction scheme 1) is not limited to the one shown in reaction scheme 1. For example, a compound (4) in which n is 0 can also be obtained by the reaction between a bisphenol compound (9) and a monoepoxy compound (10) including glycidyl methacrylate as illustrated in reaction scheme 2:
Reaction Scheme 2:
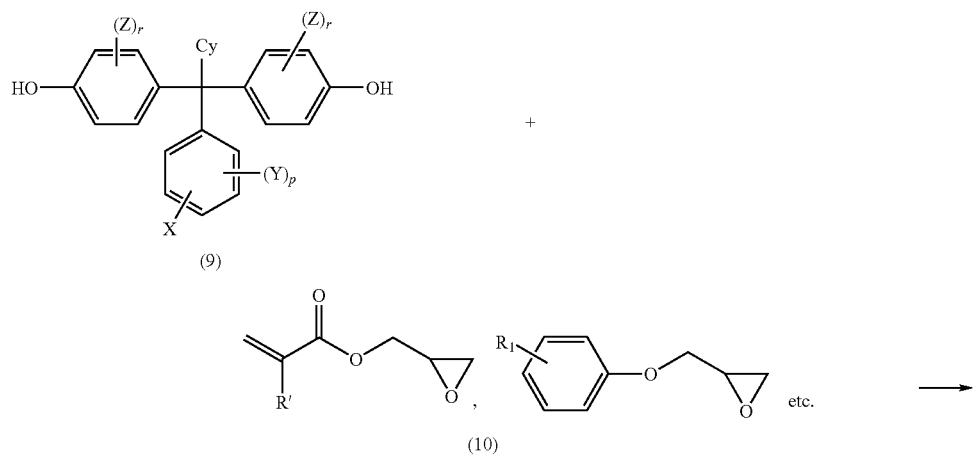
etc.

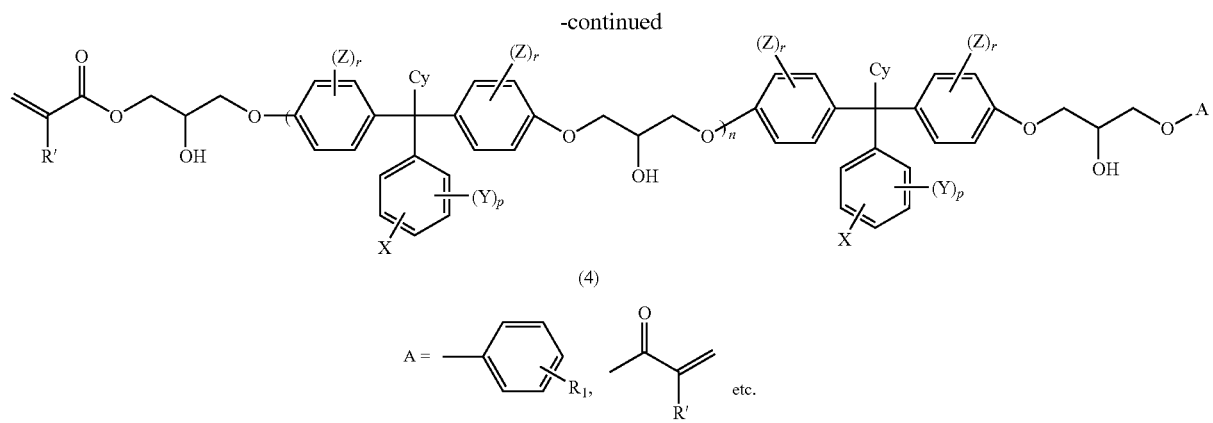

(4)

The unsaturated monobasic acid (B) that can be used to prepare the alkali-developable, colored photosensitive resin composition of the invention includes acrylic acid, methacrylic acid, crotonic acid, cinnamic acid, sorbic acid, hydroxyethyl methacrylate malate, hydroxyethyl acrylate malate, hydroxypropyl methacrylate malate, hydroxypropyl acrylate malate, and dicyclopentadiene malate.

The phenol compound as a compound (C) that can be used to obtain the alkali-developable, colored photosensitive resin composition includes phenol, chlorophenol, cresol, ethylphenol, propylphenol, cumylphenol, tert-butylphenol, tert-amylphenol, hexylphenol, octylphenol, isooctylphenol, tert-octylphenol, nonylphenol, dodecylphenol, octadecylphenol, 2,4-di-tert-butylphenol, 2,5-di-tert-butylphenol, 3,5-di-tert-butylphenol, 2,4,6-tribromophenol, 4-(1,1,3,3-tetramethylbutyl)phenol, 2-(3,5-dimethylheptyl)phenol, 4-(3,5-dimethylheptyl)phenol, terpenephenol, and naphthol.

The alcohol compound as a compound (C) that can be used to obtain the alkali-developable, colored photosensitive resin composition includes methanol, ethanol, propanol, butanol, pentanol, hexanol, heptanol, octanol, isopropyl alcohol, sec-butyl alcohol, 2-pentyl alcohol, 3-pentyl alcohol, 2-hexyl alcohol, 3-hexyl alcohol, 2-heptyl alcohol, 3-heptyl alcohol, 4-heptyl alcohol, 2-octyl alcohol, 3-octyl alcohol, 4-octyl alcohol, tert-butyl alcohol, 2-methylbutan-2-ol, 2-methylpentan-2-ol, 2-methylhexan-2-ol, 2-methylheptan-2-ol.

The amine compound as a compound (C) that can be used to obtain the alkali-developable, colored photosensitive resin composition of the invention includes methylamine, ethylamine, propylamine, butylamine, pentylamine, hexylamine, heptylamine, octylamine, dimethylamine, diethylamine, dipropylamine, dibutylamine, dipentylamine, dihexylamine, diheptylamine, dioctylamine, morpholine, and piperidine.

The carboxylic acid as a compound (C) that can be used to obtain the alkali-developable, colored photosensitive resin composition of the invention includes aliphatic, aromatic or alicyclic monocarboxylic acids, such as acetic acid, propionic acid, 2,2-dimethylolpropionic acid, lactic acid, butyric acid, octylic acid, lauric acid, linoleic acid, ricinoleic acid, benzoic acid, toluoylic acid, cinnamic acid, phenylacetic acid, and cyclohexanecarboxylic acid.

The polybasic acid anhydride (D) that can be used to obtain the alkali-developable, colored photosensitive resin composition of the invention includes monoanhydrides, such as succinic anhydride, maleic anhydride, trimellitic anhydride, pyromellitic anhydride, 2,2',3,3'-benzophenonetetracarboxylic acid anhydride, 3,3',4,4'-benzophenonetetracarboxylic acid anhydride, ethylene glycol bisanhydrotrimellitate, glycerol trisanhydrotrimellitate, phthalic anhydride, methyltetrahydrophthalic anhydride, tetrahydrophthalic anhydride, nadic anhydride, methylnadic anhydride, a trialkyltetrahydrophthalic anhydride, hexahydrophthalic anhydride, 5-(2,5-dioxotetrahydrofuryl)-3-methyl-3-cyclohexene-1,2-dicarboxylic acid anhydride, a trialkyltetrahydrophthalic anhydride-maleic anhydride adduct, dodecenylsuccinic anhydride, and methylhymic anhydride; and dianhydrides, such as 3,3',4,4'-biphenyltetracarboxylic acid dianhydride, 3,3',4,4'-diphenyltetrasulfonic acid dianhydride, 4,4'-hydroxydiphthalic dianhydride, 2,3,5-tricarboxycyclopentylacetic dianhydride, 1,2,3,4-cyclopentanetetracarboxylic acid dianhydride, and methylhexahydrophthalic anhydride. Inter alia, a dianhydride or a combination of a monoanhydride and a dianhydride is preferred.

The colorant (E) that can be used in the alkali-developable, colored photosensitive resin composition of the invention includes a pigment and a dye. There is no particular limitation in which colorant is to be added. Either one of a pigment and a dye or both of them may be used. In particular, a pigment dispersion method and a dyeing method are preferably adopted.

The pigment that can be used in the alkali-developable, colored photosensitive resin composition of the invention may be a combination of two or more pigments. Specific examples of useful organic pigments are shown below by their color index (C.I.) numbers.

Pigment blue: C.I. 1, 1:2, 1:x, 9:x, 15, 15:1, 15:2, 15:3, 15:4, 15:5, 15:6, 16, 24, 24:x, 56, 60, 61, and 62

Pigment green: C.I. 1, 1:x, 2, 2:x, 4, 7, 10, and 36

Pigment orange: C.I. 2, 5, 13, 16, 17:1, 31, 34, 36, 38, 43, 46, 48, 49, 51, 52, 59, 60, 61, 62, and 64

Pigment red: C.I. 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:3, 81:x, 83, 88, 90, 112, 119, 122, 123, 144, 146, 149, 166, 168, 169, 170, 171, 172, 175, 176, 177, 178, 179, 184, 185, 187, 188, 190, 200, 202, 206, 207, 208, 209, 210, 216, 224, and 226

Pigment violet: C.I. 1, 1:x, 3, 3:3, 3:x, 5:1, 19, 23, 27, 32, and 42

Pigment yellow: C.I. 1, 3, 12, 13, 14, 16, 17, 24, 55, 60, 65, 73, 74, 81, 83, 93, 95, 97, 98, 100, 101, 104, 106, 108, 109, 110, 113, 114, 116, 117, 119, 120, 126, 127, 128, 129, 138, 139, 150, 151, 152, 153, 154, 156, and 175

Examples of useful black pigments include #2400, #2350, #2300, #2200, #1000, #980, #970, #960, #950, #900, #850, MCF88, #650, MA600, MA7, MA8, MA11, MA100, MA220, IL30B, IL31B, IL7B, IL11B, IL52B, #4000, #4010, #55, #52, #50, #47, #45, #44, #40, #33, #32, #30, #20, #10, #5, CF9, #3050, #3150, #3250, #3750, #3950, Dia Black A, Dia Black N220M, Dia Black N234, Dia Black I, Dia Black LI, Dia Black II, Dia Black N339, Dia Black SH, Dia Black SHA, Dia Black LH, Dia Black H, Dia Black HA, Dia Black SF, Dia Black N550M, Dia Black E, Dia Black G, Dia Black R, Dia Black N760M, and Dia Black LR (trade names, all manufactured by Mitsubishi Chemical Corp.); Thermax series N990, N991, N907, N908, N990, N991, and N908 (trade names, all manufactured by Cancarb Ltd.); ASAHI #80, ASAHI #70, ASAHI #70L, ASAHI F-200, ASAHI #66, ASAHI #66HN, ASAHI #60H, ASAHI #60U, ASAHI #60, ASAHI #55, ASAHI #50, ASAHI #51, ASAHI #50U, ASAHI #50, ASAHI #35, ASAHI #15, and ASAHI Thermal (trade names, all manufactured by Asahi Carbon Co., Ltd.); and Color Black Fw200, Color Black Fw2, Color Black Fw2V, Color Black Fw1, Color Black Fw18, Color Black S170, Color Black S160, Special Black 6, Special Black 5, Special Black 4, Special Black 4A, Special Black 250, Special Black 350, Printex U, Printex V, Printex 140U, and Printex 140V (trade names, all produced by Degussa).

Inorganic pigments are also usable, including Milori blue, iron oxide, titanium oxide, calcium carbonate, magnesium carbonate, silica, alumina, cobalt based pigments, manganese based pigments, talc, chromates, ferrocyanides, sulfates, sulfides, selenides or phosphates of various metals, ultramarine blue, iron blue, cobalt blue, cerulean blue, viridian, emerald green, and cobalt green.

These pigments can be used as a mixture of two or more thereof.

Useful dyes include azo dyes, anthraquinone dyes, indigoid dyes, triarylmethane dyes, xanthene dyes, alizarine dyes, acridine dyes, stilbene dyes, thiazole dyes, naphthol dyes, quinoline dyes, nitro dyes, indamine dyes, oxazine dyes, phthalocyanine dyes, and cyanine dyes. These dyes can be used as a mixture of two or more thereof.

The amount of the colorant (E) in the alkali-developable, colored photosensitive resin composition of the invention is preferably 3% to 70% by weight, still preferably 5% to 60% by weight, based on the alkali-developable resin composition made into a solution form by adding a solvent described below.

The alkali-developable resin composition is usually used in the form of a solution prepared by adding a solvent capable of dissolving or dispersing the aforementioned components according to necessity. The solvent includes acetone, methyl ethyl ketone, methyl isobutyl ketone, cyclohexanone, methyl cellosolve, ethyl cellosolve, propylene glycol monomethyl ether acetate, chloroform, methylene chloride, hexane, heptane, octane, cyclohexane, benzene, toluene, xylene, methanol, ethanol, and isopropyl alcohol.

The amount of the reaction product obtained by adding the component (B) and, if desired, the component (C) to the component (A), esterifying the adduct and the component (D), and, if desired, reacting the resulting product with the component (G) is preferably 1% to 70% by weight, still preferably 3% to 30% by weight, based on the above-described composition in a solution form.

Conventionally known compounds can be used as the photopolymerization initiator (F) in the alkali-developable, colored photosensitive resin composition of the invention. Examples are benzophenone, phenyl biphenyl ketone, 1-hydroxy-1-benzoylcyclohexane, benzil, benzyl dimethyl ketal, 1-benzyl-1-dimethylamino-1-(4'-morpholinobenzoyl)propane, 2-morpholyl-2-(4'-methylmercapto)benzoylpropane, thioxanthone, 1-chloro-4-propoxythioxanthone, isopropylthioxanthone, diethylthioxanthone, ethylanthraquinone, 4-benzoyl-4'-methyldiphenyl sulfide, benzoin butyl ether, 2-hydroxy-2-benzoylpropane, 2-hydroxy-2-(4'-isopropyl)benzoylpropane, 4-butylbenzoyltrichloromethane, 4-phenoxybenzoyldichloromethane, methyl benzoylformate, 1,7-bis(9'-acridinyl)heptane, 9-n-butyl-3,6-bis(2'-morpholinoisobutyroyl)carbazole, 2-methyl-1-[4-(methylthio)phenyl]-2-morpholinopropan-1-one, 2-methyl-4,6-bis(trichloromethyl)-s-triazine, 2-phenyl-4,6-bis(trichloromethyl)-s-triazine, 2-naphthyl-4,6-bis(trichloromethyl)-s-triazine, and compound Nos. 10 and 11 shown below.

Compound No. 10:

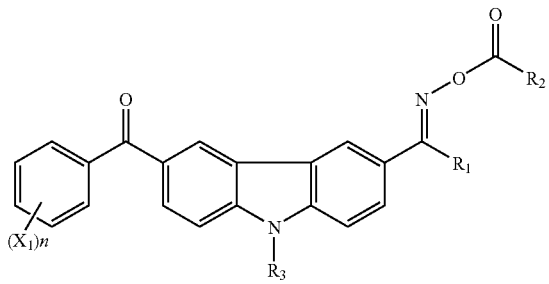

wherein $X_1$ represents a halogen atom or an alkyl group; $R_1$ represents R, OR, COR, SR, CONRR' or CN; $R_2$ represents R, OR, COR, SR or NRR'; $R_3$ represents R, OR, COR, SR or NRR'; R and R' each represent an alkyl group, an aryl group, an aralkyl group or a heterocyclic group each of which may be substituted with a halogen atom and/or a heterocyclic group, and the alkyl group and the alkylene moiety of the aralkyl group may be interrupted in the chain by an unsaturated bond, an ether bond, a thioether bond or an ester bond; or R and R' are taken together to form a ring; and n represents 0 to 5.

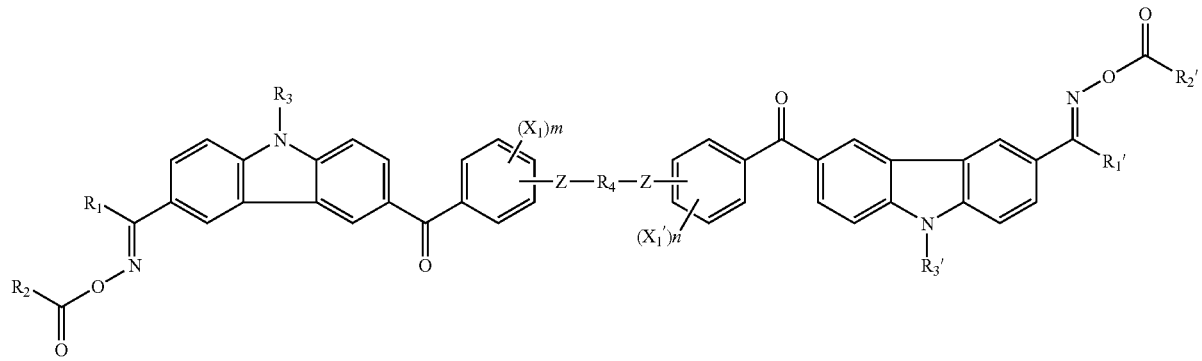

Compound No. 11 wherein $X_1$, $R_1$, $R_2$, $R_3$, R, and R' are as defined with respect to compound No. 10; $X_1$' represents a halogen atom or an alkyl group; Z represents an oxygen atom or a sulfur atom; m and n each represent a number of 1 to 5; $R_1$' represents R, OR, COR, SR, CONRR' or CN; $R_2$' represents R, OR, COR, SR or NRR'; $R_3$' represents R, OR, COR, SR or NRR'; and $R_4$ represents a diol residue or a dithiol residue.

The amount of the photopolymerization initiator in the alkali-developable, colored photosensitive resin composition of the invention is preferably 0.1% to 30% by weight, still preferably 0.5% to 5% by weight, based on the alkali-developable resin composition made into a solution form by adding a solvent.

The epoxy compound (G) can be used in the invention for the purpose of acid value adjustment. It is used to improve the developability of the alkali-developable, colored photosensitive resin composition of the invention. Examples of the epoxy compound include glycidyl methacrylate, methyl glycidyl ether, ethyl glycidyl ether, propyl glycidyl ether, isopropyl glycidyl ether, butyl glycidyl ether, isobutyl glycidyl ether, t-butyl glycidyl ether, pentyl glycidyl ether, hexyl glycidyl ether, heptyl glycidyl ether, octyl glycidyl ether, nonyl glycidyl ether, decyl glycidyl ether, undecyl glycidyl ether, dodecyl glycidyl ether, tridecyl glycidyl ether, tetradecyl glycidyl ether, pentadecyl glycidyl ether, hexadecyl glycidyl ether, 2-ethylhexyl glycidyl ether, allyl glycidyl ether, propargyl glycidyl ether, p-methoxyethyl glycidyl ether, phenyl glycidyl ether, p-methoxy glycidyl ether, p-butylphenol glycidyl ether, cresyl glycidyl ether, 2-methylcresyl glycidyl ether, 4-nonylphenyl glycidyl ether, benzyl glycidyl ether, p-cumylphenyl glycidyl ether, trityl glycidyl ether, 2,3-epoxypropyl methacrylate, epoxidized soybean oil, epoxidized linseed oil, glycidyl butyrate, vinylcyclohexane monoxide, 1,2-epoxy-4-vinylcyclohexane, styrene oxide, pinene oxide, methylstyrene oxide, cyclohexene oxide, propylene oxide, and compound Nos. 12 and 13 shown below.

The solids content of the alkali-developable, colored photosensitive resin composition of the invention preferably has an acid value ranging from 60 to 120 mgKOH/g.

Compound No. 12:

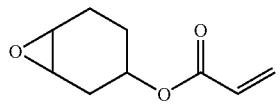

-continued

Compound No. 13:

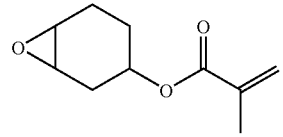

The alkali-developable, colored photosensitive resin composition of the present invention may further contain a monomer having an unsaturated bond, a chain transfer agent, a surface active agent, and so forth.

The monomer having an unsaturated bond includes 2-hydroxyethyl acrylate, 2-hydroxypropyl acrylate, isobutyl acrylate, n-octyl acrylate, isooctyl acrylate, isononyl acrylate, stearyl acrylate, methoxyethyl acrylate, dimethylaminoethyl acrylate, zinc acrylate, 1,6-hexanediol diacrylate, trimethylolpropane triacrylate, 2-hydroxyethyl methacrylate, 2-hydroxypropyl methacrylate, butyl methacrylate, tert-butyl methacrylate, cyclohexyl methacrylate, trimethylolpropane trimethacrylate, dipentaerythritol pentaacrylate, dipentaerythritol hexaacrylate, pentaerythritol tetraacrylate, and pentaerythritol triacrylate.

The chain transfer agent includes mercapto compounds, such as thioglycolic acid, thiomalic acid, thiosalicylic acid, 2-mercaptopropionic acid, 3-mercaptopropionic acid, 3-mercaptobutyric acid, N-(2-mercaptopropionyl)glycine, 2-mercaptonicotinic acid 3-[N-(2-mercaptoethyl)carbamoyl]propionic acid, 3-[N-(2-mercaptoethyl)amino]propionic acid, N-(3-mercaptopropionyl)alanine, 2-mercaptoethanesulfonic acid, 3-mercaptopropanesulfonic acid, 4-mercaptobutanesulfonic acid, dodecyl (4-methylthio)phenyl ether, 2-mercaptoethanol, 3-mercapto-1,2-propanediol, 1-mercapto-2-propanol, 3-mercapto-2-butanol, mercaptophenol, 2-mercaptoethylamine, 2-mercaptoimidazole, 2-mercapto-3-pyridinol, 2-mercaptobenzothiazole, mercaptoacetic acid, trimethylolpropane tris(3-mercaptopropionate), and pentaerythritol tetrakis(3-mercaptopropionate); disulfide compounds obtained by oxidizing the recited mercapto compounds; and iodized alkyl compounds, such as iodoacetic acid, iodopropionic acid, 2-iodoethanol, 2-iodoethanesulfonic acid, and 3-iodopropanesulfonic acid.

The surface active agent that can be used include fluorine-containing surface active agents, such as perfluoroalkylphosphoric esters and perfluoroalkylcarboxylic acid salts; anionic surface active agents, such as higher fatty acid alkali salts, alkylsulfonates, and alkylsulfates; cationic surface active agents, such as higher amine halogenic acid salts and quaternary ammonium salts; nonionic surface active agents, such as polyethylene glycol alkyl ethers, polyethylene glycol fatty acid esters, sorbitan fatty acid esters, and fatty acid monoglycerides; amphoteric surface active agents, and silicone surface active agents. These surface active agents can be used as a combination thereof.

The alkali-developable, colored photosensitive resin composition of the invention can further contain a thermoplastic organic polymer to improve the characteristics of its cured product. Examples of the thermoplastic organic polymer include polystyrene, polymethyl methacrylate, a methyl methacrylate-ethyl acrylate copolymer, poly(meth)acrylic acid, a styrene-(meth)acrylic acid copolymer, a (meth)acrylic acid-methyl methacrylate copolymer, polyvinyl butyral, cellulose esters, polyacrylamide, and saturated polyesters.

If desired, the alkali-developable, colored photosensitive resin composition of the invention may contain commonly employed additives, such as a thermal polymerization suppressor, such as anisole, hydroquinone, pyrocatechol, tert-butyl catechol, and phenothiazine, a plasticizer, an adhesion accelerator, a filler, a defoaming agent, and a leveling agent.

The color filter according to the present invention essentially has a substrate and a plurality of transparent colored coating films arrayed in a pattern on the substrate. At least one of the transparent colored coating films is formed of the alkali-developable, colored photosensitive resin composition of the invention.

The substrate that can be used in the color filter of the invention is not limited as long as rigidity and smoothness are secured to certain extents. In applications where the color filter is of a transmission type, the substrate should have transparency.

The substrate that can be used includes plates of glass or plastics, such as polyethylene terephthalate (PET). A black matrix may previously be provided on the substrate using the alkali-developable, colored photosensitive resin composition of the invention or other photosensitive resin composition or a metal, e.g., chromium.

An illustrative example of a method of producing the color filter of the invention will be described. The alkali-developable, colored photosensitive resin composition of the invention is applied to a transparent substrate, such as glass, using a known means, such as a spin coater, a roll coater or a curtain coater. The coating layer is exposed to light through a photomask having a prescribed pattern. The unexposed part of the coating layer is removed with an aqueous solution of an alkali, e.g., sodium carbonate, to carry out development. These operations are repeated for each color to form colored coating films of different desired colors to obtain the color filter of the present invention.

The above-described method is applicable to not only formation of transparent colored films but formation of a black matrix. Instead of applying the alkali-developable, colored photosensitive resin composition to a substrate, the composition may be once applied to a temporary support, such as a blanket (a transfer cylinder) or a film, and the coating layer on the temporary support is then transferred to a substrate.

A light source emitting active light for curing the alkali-developable, colored photosensitive resin composition of the invention includes those emitting light having wavelengths between 300 nm and 450 nm, such as an ultrahigh pressure mercury lamp, a mercury vapor arc lamp, a carbon arc lamp, and a xenon arc lamp.

Application of the alkali-developable, colored photosensitive resin composition of the present invention is not particularly limited. It is applicable to not only color filters but also other various applications including photocuring coatings, photocuring adhesives, printing plates, and photoresists for printed wiring boards.

The color filter using the alkali-developable, colored photosensitive resin composition of the invention can have varied constituent elements depending on the use. The configuration of the color filter is not restricted. In general, the color filter is composed of a transparent substrate and a plurality of transparent films of different colors arrayed in a pattern on the transparent substrate. White light incident on the films is colored in the color of each of the films.

In applications to liquid crystal displays, plasma displays, electroluminescent panels, etc., light from a light source incorporated into a display or sunlight entering through the screen is made use of as incident light, and the colored light transmitted through the color filter enables color display. In applications to color camcorders and digital cameras, the color filter is used as a constituent part of a solid-state image sensor and serves to separate light from an object of interest. The separated light is converted into electrical signals by a light detector, and the signals are recorded to enable color photographing.

EXAMPLES

The present invention will now be illustrated in greater detail with reference to Examples, but the present invention should not be construed as being limited thereto.

Preparation Example 1

Preparation of Alkali-Developable Resin Composition No. 1

Step 1: Synthesis of 1,1-bis(4'-hydroxyphenyl)-1-(1"-biphenyl)-1-cyclohexylmethane In a reactor were put 70.5 g of biphenyl cyclohexyl ketone. 200.7 g of phenol, and 10.15 g of thioacetic acid, and 40.0 g of trifluoromethanesulfonic acid was added thereto dropwise at 18° C. over 20 minutes. After allowing the mixture to react at 17° to 19° C. for 18 hours, 500 g of water was added to stop the reaction. To the reaction mixture was added 500 g of toluene, and the organic layer, was extracted by washing with water until the pH of the organic layer became between 3 and 4. Toluene, water, and excess phenol were removed by evaporation. Toluene was added to the residue, and the precipitated solid was collected by filtration and washed by dispersing in toluene to give 59.2 g (yield: 51%) of pale yellow crystals, which were found to have a melting point of 239.5° C. and identified to be the title compound.

Step 2: Synthesis of 1,1-bis(4'-epoxypropoxyphenyl)-1-(1"-biphenyl)-1-cyclohexylmethane In a reactor were put 57.5 g of the 1,1-bis(4'-hydroxyphenyl)-1-(1"-biphenyl)-1-cyclohexylmethane and 195.8 g of epichlorohydrin, and 0.602 g of benzyltriethylammonium chloride was added thereto, followed by stirring at 64° C. for 18 hours. The liquid temperature was dropped to 54° C., and 43.0 g of a 24 wt % aqueous solution of sodium hydroxide was added thereto dropwise, followed by stirring for 30 minutes. Epichlorohydrin and water were removed by evaporation, and 216 g of methyl isobutyl ketone was added to the residue. The mixture was washed with water, and 2.2 g of a 24 wt % sodium hydroxide aqueous solution was added thereto dropwise. After stirring at 80° C. for 2 hours, the mixture was cooled to room temperature, neutralized with a 3 wt % sodium monophosphate aqueous solution, and washed with water. The solvent was removed by evaporation to give 57 g (yield: 79%) of a yellow solid (melting point: 64.2° C.; epoxy equivalent: 282; n=0.04). The solid was confirmed to be the title compound.

Step 3: Preparation of Alkali-Developable Resin Composition No. 1

In a reactor were put 43 g of the 1,1-bis(4'-epoxypropoxyphenyl)-1-(1"-biphenyl)-1-cyclohexylmethane obtained in step 2 (hereinafter sometimes referred to as compound (a)), 11 g of acrylic acid (hereinafter sometimes referred to as component (b)), 0.05 g of 2,6-di-tert-butyl-p-cresol, 0.11 g of tetrabutylammonium acetate, and 23 g of propylene glycol 1-monomethyl ether 2-acetate, and the mixture was stirred at 120° C. for 16 hours. After cooling to room temperature, 35 g of propylene glycol 1-monomethyl ether 2-acetate and 9.4 g of biphenyltetracarboxylic acid dianhydride (hereinafter sometimes referred to as compound (d-1)) were added, followed by stirring at 120° C. for 8 hours. To the reaction mixture was further added 6.0 g of tetrahydrophthalic anhydride (hereinafter sometimes referred to as compound (d-2)), followed by stirring at 120° C. for 4 hours, 100° C. for 3 hours, 80° C. for 4 hours, 60° C. for 6 hours, and finally at 40° C. for 11 hours. To the mixture was added 29 g of propylene glycol 1-monomethyl ether 2-acetate to make a propylene glycol 1-monomethyl ether 2-acetate solution. There was thus obtained alkali-developable resin composition No. 1 as a desired product (Mw: 4000; Mn: 2100; acid value (on solid basis): 86 mgKOH/g).

The reaction product contained in the alkali-developable resin composition No. 1 was the result of esterification reaction between an epoxy adduct, which had a structure formed by adding compound (b) (component (B)) to compound (a) (component (A)), and component (D), i.e., compounds (d-1) and (d-2) at a ratio of the acid anhydride structure of component (D) to the hydroxyl group of the epoxy adduct of 0.68. The epoxy adduct had a structure formed by adding 1.0 carboxyl group of compound (b) per epoxy group of compound (a).

Preparation Example 2

Preparation of Alkali-Developable Resin Composition No. 2

In a reactor were put 43 g of the 1,1-bis(4'-epoxypropoxyphenyl)-1-(1"-biphenyl)-1-cyclohexylmethane (compound (a)), 11 g of acrylic acid (component (b)), 0.05 g of 2,6-di-tert-butyl-p-cresol, 0.11 g of tetrabutylammonium acetate, and 23 g of propylene glycol 1-monomethyl ether 2-acetate, and the mixture was stirred at 120° C. for 16 hours. After cooling to room temperature, 35 g of propylene glycol 1-monomethyl ether 2-acetate and 16 g of biphenyltetracarboxylic acid dianhydride (compound (d-1)) were added, followed by stirring at 120° C. for 8 hours. To the reaction mixture was further added 0.7 g of tetrahydrophthalic anhydride (compound (d-2)), followed by stirring at 120° C. for 4 hours, 100° C. for 3 hours, 80° C. for 4 hours, 60° C. for 6 hours, and finally at 40° C. for 11 hours. To the mixture was added 29 g of propylene glycol 1-monomethyl ether 2-acetate to make a propylene glycol 1-monomethyl ether 2-acetate solution. There was thus obtained alkali-developable resin composition No. 2 as a desired product (Mw: 8100; Mn: 2900; acid value (on solid basis): 89 mgKOH/g).

The reaction product contained in the alkali-developable resin composition No. 2 was the result of esterification reaction between an epoxy adduct having compound (b) (component (B)) added to compound (a) (component (A)) and component (D), i.e., compounds (d-1) and (d-2) at a ratio of the acid anhydride structure of component (D) to the hydroxyl group of the epoxy adduct of 0.74. The epoxy adduct had a structure formed by adding 1.0 carboxyl group of compound (b) per epoxy group of compound (a).

Preparation Example 3

Preparation of Alkali-Developable Resin Composition No. 3

In a reactor were put 43 g of the 1,1-bis(4'-epoxypropoxyphenyl)-1-(1"-biphenyl)-1-cyclohexylmethane (compound (a)), 11 g of acrylic acid (component (b)), 0.05 g of 2,6-di-tert-butyl-p-cresol, 0.11 g of tetrabutylammonium acetate, and 23 g of propylene glycol 1-monomethyl ether 2-acetate, and the mixture was stirred at 120° C. for 16 hours. After cooling to room temperature, 35 g of propylene glycol 1-monomethyl ether 2-acetate, 16 g of biphenyltetracarboxylic acid dianhydride (compound (d-1)), and 39 mg of tetra-n-butylammonium bromide were added, followed by stirring at 120° C. for 4 hours, 100° C. for 3 hours, 80° C. for 4 hours, 60° C. for 6 hours, and finally at 40° C. for 11 hours. To the reaction mixture was added 29 g of propylene glycol 1-monomethyl ether 2-acetate to make a propylene glycol 1-monomethyl ether 2-acetate solution. There was thus obtained alkali-developable resin composition No. 3 as a desired product (Mw: 8600; Mn: 3000; acid value (on solid basis): 87 mgKOH/g).

The reaction product contained in the alkali-developable resin composition No. 3 was the result of esterification reaction between an epoxy adduct having compound (b) (component (B)) added to compound (a) (component (A)) and compound (d-1) (component (D)) at a ratio of the acid anhydride structure of component (D) to the hydroxyl group of the epoxy adduct of 0.71. The epoxy adduct had a structure formed by adding 1.0 carboxyl group of compound (b) per epoxy group of compound (a).

Comparative Preparation Example 1

Preparation of Alkali-Developable Resin Composition No. 4

In a reactor were put 184 g of a bisphenol fluorene type epoxy resin (epoxy equivalent: 231), 58 g of acrylic acid, 0.26 g of 2,6-di-tert-butyl-p-cresol, 0.11 g of tetrabutylammonium acetate, and 23 g of propylene glycol 1-monomethyl ether 2-acetate, and the mixture was stirred at 120° C. for 16 hours. After cooling to room temperature, 35 g of propylene glycol 1-monomethyl ether 2-acetate, 59 g of biphthalic anhydride, and 0.24 g of tetra-n-butylammonium bromide were added, followed by stirring at 120° C. for 4 hours. To the mixture was further added 20 g of tetrahydrophthalic anhydride, followed by stirring at 120° C. for 4 hours, 100° C. for 3 hours, 80° C. for 4 hours, 60° C. for 6 hours, and finally at 40° C. for 11 hours. To the reaction mixture was added 90 g of propylene glycol 1-monomethyl ether 2-acetate to make a propylene glycol 1-monomethyl ether 2-acetate solution. There was thus obtained alkali-developable resin composition No. 4 as a desired product (Mw: 5000; Mn: 2100; acid value (on solid basis): 92.7 mgKOH/g).

Comparative Preparation Example 2

Preparation of Alkali-Developable Resin Composition No. 5

In a reactor were put 154 g of a bisphenol A epoxy resin (epoxy equivalent: 190), 59 g of: acrylic acid, 0.26 g of 2,6-di-tert-butyl-p-cresol, 0.11 g of tetrabutylammonium acetate, and 23 g of propylene glycol 1-monomethyl ether 2-acetate, and the mixture was stirred at 120° C. for 16 hours. After cooling to room temperature, 35 g of propylene glycol 1-monomethyl ether 2-acetate, 67 g of biphthalic anhydride, and 0.24 g of tetra-n-butylammonium bromide were added, followed by stirring at 120° C. for 4 hours, 100° C. for 3 hours, 80° C. for 4 hours, 60° C. for 6 hours, and finally at 40° C. for 11 hours. To the reaction mixture was added 90 g of propylene glycol 1-monomethyl ether 2-acetate to make a propylene glycol 1-monomethyl ether 2-acetate solution. There was thus obtained alkali-developable resin composition No. 5 as a desired product (Mw: 7500; Mn: 2100; acid value (on solid basis): 91 mgKOH/g). tetrabutylammonium acetate, and 23 g of propylene glycol 1-monomethyl ether 2-acetate, and the mixture was stirred at 120° C. for 16 hours. After cooling to room temperature, 35 g of propylene glycol 1-monomethyl ether 2-acetate, 59 g of biphthalic anhydride, and 0.24 g of tetra-n-butylammonium bromide were added, followed by stirring at 120° C. for 4 hours. To the mixture was further added 20 g of tetrahydrophthalic anhydride, followed by stirring at 120° C. for 4 hours, 100° C. for 3 hours, 80° C. for 4 hours, 60° C. for 6 hours, and finally at 40° C. for 11 hours. To the reaction mixture was added 90 g of propylene glycol 1-monomethyl ether 2-acetate to make a propylene glycol 1-monomethyl ether 2-acetate solution. There was thus obtained alkali-developable resin composition No. 4 as a desired product (Mw: 5000; Mn: 2100; acid value (on solid basis): 92.7 mgKOH/g).

Comparative Preparation Example 2

Preparation of Alkali-Developable Resin Composition No. 5

In a reactor were put 154 g of a bisphenol A epoxy resin (epoxy equivalent: 190), 59 g of acrylic acid, 0.26 g of 2,6-di-tert-butyl-p-cresol, 0.11 g of tetrabutylammonium acetate, and 23 g of propylene glycol 1-monomethyl ether 2-acetate, and the mixture was stirred at 120° C. for 16 hours. After cooling to room temperature, 35 g of propylene glycol 1-monomethyl ether 2-acetate, 67 g of biphthalic anhydride, and 0.24 g of tetra-n-butylammonium bromide were added, followed by stirring at 120° C. for 4 hours, 100° C. for 3 hours, 80° C. for 4 hours, 60° C. for 6 hours, and finally at 40° C. for 11 hours. To the reaction mixture was added 90 g of propylene glycol 1-monomethyl ether 2-acetate to make a propylene glycol 1-monomethyl ether 2-acetate solution. There was thus obtained alkali-developable resin composition No. 5 as a desired product (Mw: 7500; Mn: 2100; acid value (on solid basis): 91 mgKOH/g). sodium monophosphate aqueous solution, washed with water, and heated to evaporate the solvent. There was obtained 38.7 g (yield: 80%) of a yellow viscous liquid (epoxy equivalent: 248; n=0.04), which was confirmed to be the title compound.

Step 3: Preparation of Alkali-Developable Resin Composition No. 6

In a reactor were put 49.6 g of 1,1-bis(4'-epoxypropoxyphenyl)-1-(1"-biphenyl)ethane, 14.4 g of acrylic acid, 0.05 g of 2,6-di-tert-butyl-p-cresol, 0.14 g of tetrabutylammonium acetate, and 27.4 g of propylene glycol 1-monomethyl ether 2-acetate, and the mixture was stirred at 120° C. for 16 hours. After cooling to room temperature, 41.5 g of propylene glycol 1-monomethyl ether 2-acetate and 12.4 g of biphenyltetracarboxylic acid dianhydride were added thereto, followed by stirring at 120° C. for 8 hours. To the reaction mixture was further added 7.9 g of tetrahydrophthalic anhydride, followed by stirring at 120° C. for 4 hours, 100° C. for 3 hours, 80° C. for 4 hours, 60° C. for 6 hours, and finally at 40° C. for 11 hours. To the reaction mixture was added 34 g of propylene glycol 1-monomethyl ether 2-acetate to make a propylene glycol 1-monomethyl ether 2-acetate solution. There was thus obtained alkali-developable resin composition No. 6 as a desired product (Mw: 3700; Mn: 1900; acid value (on solid basis): 93 mgKOH/g).

Example 1

Preparation of Alkali-Developable, Colored Photosensitive Resin Composition No. 1

To 12 g of alkali-developable resin composition No. 1 obtained in Preparation Example 1 were added 8 g of trimethylolpropane triacrylate, 1.8 g of benzophenone, 3.2 g of carbon black (MA100 from Mitsubishi Chemical Corp.), and 75 g of ethyl cellosolve, and the mixture was stirred well to provide alkali-developable, colored photosensitive resin composition No. 1.

Example 2

Preparation of Alkali-Developable, Colored Photosensitive Resin Composition No. 2

To 12 g of alkali-developable resin composition No. 2 obtained in Preparation Example 2 were added 8 g of trimethylolpropane triacrylate, 1.8 g of benzophenone, 3.2 g of carbon black (MA100 from Mitsubishi Chemical Corp.), and 75 g of ethyl cellosolve, and the mixture was stirred well to provide alkali-developable, colored photosensitive resin composition No. 2.

Example 3

Preparation of Alkali-Developable, Colored Photosensitive Resin Composition No. 3

To 12 g of alkali-developable resin composition No. 1 obtained in Preparation Example 1 were added 5.6 g of trimethylolpropane triacrylate, 0.6 g of a copper halide phthalocyanine pigment (6YK from Toyo Ink Mfg. Co., Ltd.), 1.8 g of benzophenone, and 80 g of ethyl cellosolve, and the mixture was stirred well to prepare alkali-developable, colored photosensitive resin composition No. 3.

Example 4

Preparation of Alkali-Developable, Colored Photosensitive Resin Composition No. 4

To 12 g of alkali-developable resin composition No. 2 obtained in Preparation Example 2 were added 5.6 g of trimethylolpropane triacrylate, 0.6 g of a copper halide phthalocyanine pigment (6YK from Toyo Ink Mfg. Co., Ltd.), 1.8 g of benzophenone, and 80 g of ethyl cellosolve, and the mixture was stirred well to give alkali-developable, colored photosensitive resin composition No. 4.

Comparative Example 1

Preparation of Alkali-Developable, Colored Photosensitive Resin Composition No. 5

To 12 g of alkali-developable resin composition No. 4 obtained in Comparative Preparation Example 1 were added 8 g of trimethylolpropane triacrylate, 1.8 g of benzophenone, 3.2 g of carbon black (MA100 from Mitsubishi Chemical Corp.), and 75 g of ethyl cellosolve, and the mixture was stirred well to provide alkali-developable, colored photosensitive resin composition No. 5.

Comparative Example 2

Preparation of Alkali-Developable, Colored Photosensitive Resin Composition No. 6

To 12 g of alkali-developable resin composition No. 5 obtained in Comparative Preparation Example 2 were added 8 g of trimethylolpropane triacrylate, 1.8 g of benzophenone, 3.2 g of carbon black (MA100 from Mitsubishi Chemical Corp.), and 75 g of ethyl cellosolve, and the mixture was stirred well to provide alkali-developable, colored photosensitive resin composition No. 6.

Comparative Example 3

Preparation of Alkali-Developable, Colored Photosensitive Resin Composition No. 7

To 12 g of alkali-developable resin composition No. 6 obtained in Comparative Preparation Example 3 were added 8 g of trimethylolpropane triacrylate, 1.8 g of benzophenone, 3.2 g of carbon black, and 75 g of ethyl cellosolve, and the mixture was stirred well to provide alkali-developable, colored photosensitive resin composition No. 7.

Test:

Gamma-glycidoxypropylmethylethoxysilane was applied to a substrate by spin coating and dried well by spin drying. Each of the alkali-developable, colored photosensitive resin composition Nos. 1 through 7 prepared in Examples 1 to 4 and Comparative Examples 1 to 3 was applied thereon by spin coating at 1000 rpm for 40 seconds and dried. The coating layer was prebaked at 70° C. for 20 minutes and exposed to light from an ultrahigh pressure mercury lamp through a mask having a pixel size of 30 μm by 100 μm. The coating film was developed with a 2.5% sodium carbonate aqueous solution, washed with a water thoroughly, further washed with water, and dried, followed by baking at 230° C. for 1 hour to fix the pattern. The following evaluation was made. The results are shown in Table 1 below.

(1) Sensitivity

Those for which an exposure of 100 mJ/cm$^2$ was sufficient were rated "a". Those for which an exposure of 100 mJ/cm$^2$ was insufficient and which were exposed at 200 mJ/cm$^2$ were rated "b".

(2) Resolution

Those which succeeded in satisfactorily patterning at a line width less than 10 μm were rated "A". Those which succeeded in satisfactorily patterning at a line with of 10 to 30 μm were rated "B". Those which were capable of patterning at a line with exceeding 30 μm were rated "C".

(3) Storage Stability

The alkali-developable, colored photosensitive resin compositions as prepared were left to stand in a 25° C. environment for one month. Those which showed no change in viscosity between after the preparation and after the standing were rated "G (good)", and those which underwent an increase or a decrease in viscosity were rated "NG (no good)".

(4) Adhesion

Peeling test with Scotch tape was conducted on a cross-hatched area of the heat treated coating film in accordance with the test method of JIS D0202. The adhesion was rated "G (good)" when no peeling was observed or "NG (no good)" when peeling was observed.

(5) Alkali Resistance

The heat treated coating film was immersed (a) in a 5 wt % NaOH aqueous solution for 24 hours, (b) in a 4 wt % KOH aqueous solution at 50° C. for 10 minutes or (c) in a 1 wt % NaOH aqueous solution at 80° C. for 5 minutes. After the immersion, the appearance of the film was evaluated with the naked eye. The alkali resistance was rated "G (good)" when neither change of appearance nor peeling of the resist film was observed or "NG (no good)" when lifting and/or peeling of the resist film was observed.

TABLE 1

| | Sensitivity | Resolution | Storage Stability | Adhesion | Alkali Resistance |
|---|---|---|---|---|---|
| Example 1 | a | A | G | G | G |
| Example 2 | a | A | G | G | G |
| Example 3 | a | A | G | G | G |
| Example 4 | a | A | G | G | G |
| Compara. Example 1 | b | C | NG | NG | NG |
| Compara. Example 2 | b | C | NG | NG | NG |
| Compara. Example 3 | b | C | NG | NG | NG |

It was proved that the alkali-developable, colored photosensitive resin compositions of the present invention have high sensitivity, high resolving power, and satisfactory storage stability. The coating films obtained therefrom (Examples 1 to 4) were proved excellent in adhesion to a substrate and alkali resistance.

In contrast, the alkali-developable, colored photosensitive resin compositions of Comparative Examples needed an increased exposure on account of their low sensitivity and reproduced only line widths exceeding 30 μm due to low resolution. They were also inferior in storage stability. The coating films obtained therefrom (Comparative Examples 1 to 3) were unsatisfactory in adhesion to a substrate and alkali resistance.

INDUSTRIAL APPLICABILITY

The alkali-developable, colored photosensitive resin composition of the present invention is excellent in sensitivity, resolution, and storage stability. The color filter using a film formed of the composition of the invention is excellent in adhesion between the film and the substrate and alkali resistance.

The invention claimed is:

1. An alkali-developable, colored photosensitive resin composition obtained by adding (E) a colorant and (F) a photopolymerization initiator to an alkali-developable resin composition, the alkali-developable resin composition containing a reaction product obtained by esterification between an epoxy adduct and (D) a polybasic acid anhydride, the epoxy adduct having a structure formed by adding (B) an unsaturated monobasic acid and (C) a compound selected from a phenol compound, an alcohol compound, an amine compound, and a carboxylic acid to (A) an epoxy resin represented by general formula (I) shown below, the epoxy adduct having a structure formed by adding 0.1 to 1.0 carboxyl group of the unsaturated monobasic acid (B) and 0 to 0.9 phenolic hydroxyl group, alcoholic hydroxyl group, amino group or carboxyl group of the compound (C) per epoxy group of the epoxy resin (A), with the sum of the carboxyl group of the unsaturated monobasic acid (B) and the phenolic hydroxyl group, alcoholic hydroxyl group, amino group or carboxyl group of the compound (C) being 0.1 to 1.0 per epoxy group, and the esterification being carried out at a ratio of 0.1 to 1.0 anhydrous structure of the polybasic acid anhydride (D) per hydroxyl group of the epoxy adduct

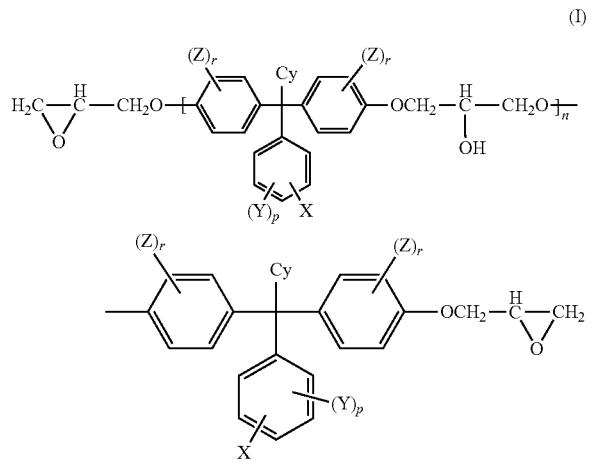

wherein Cy represents a cycloalkyl group having 3 to 10 carbon atoms; X represents a hydrogen atom, a phenyl group which may be substituted with an alkyl group having 1 to 10 carbon atoms or an alkoxy group having 1 to 10 carbon atoms, or a cycloalkyl group having 3 to 10 carbon atoms; Y and Z each represent an alkyl group having 1 to 10 carbon atoms, an alkoxy group having 1 to 10 carbon atoms, an alkenyl group having 2 to 10 carbon atoms or a halogen atom; the alkyl group, the alkoxy group, and the alkenyl group may be substituted with a halogen atom; n represents a number of 0 to 10; p represents a number of 0 to 5; and r represents a number of 0 to 4.

2. The alkali-developable, colored photosensitive resin composition according to claim 1, wherein the reaction product is further reacted with (G) an epoxy compound.

3. The alkali-developable, colored photosensitive resin composition according to claim 2, wherein, in the general formula (I), Cy is a cyclohexyl group, X is a phenyl group, and p and r are each 0.

4. A color filter comprising a substrate and a plurality of transparent colored coating films different in color arrayed in a pattern on the substrate and adapted to let incident light exit as colored light, at least one of the transparent colored coating films being formed of the alkali-developable, colored photosensitive resin composition according to claim 2.

5. A color filter comprising a substrate, a plurality of transparent colored coating films different in color arrayed in a pattern on the substrate and adapted to let incident light exit as colored light, and a black matrix, the black matrix being formed of the alkali-developable, colored photosensitive resin composition according to claim 2.

6. The alkali-developable, colored photosensitive resin composition according to claim 1, wherein, in the general formula (I), Cy is a cyclohexyl group, X is a phenyl group, and p and r are each 0.

7. A color filter comprising a substrate and a plurality of transparent colored coating films different in color arrayed in a pattern on the substrate and adapted to let incident light exit as colored light, at least one of the transparent colored coating films being formed of the alkali-developable, colored photosensitive resin composition according to claim 6.

8. A color filter comprising a substrate, a plurality of transparent colored coating films different in color arrayed in a pattern on the substrate and adapted to let incident light exit as colored light, and a black matrix, the black matrix being formed of the alkali-developable, colored photosensitive resin composition according to claim 6.

9. A color filter comprising a substrate and a plurality of transparent colored coating films different in color arrayed in a pattern on the substrate and adapted to let incident light exit as colored light, at least one of the transparent colored coating films being formed of the alkali-developable, colored photosensitive resin composition according to claim 1.

10. A color filter comprising a substrate, a plurality of transparent colored coating films different in color arrayed in a pattern on the substrate and adapted to let incident light exit as colored light, and a black matrix, the black matrix being formed of the alkali-developable, colored photosensitive resin composition according to claim 3.

11. A color filter comprising a substrate, a plurality of transparent colored coating films different in color arrayed in a pattern on the substrate and adapted to let incident light exit as colored light, and a black matrix, the black matrix being formed of the alkali-developable, colored photosensitive resin composition according to claim 1.

* * * * *